(12) United States Patent
Kelkar

(10) Patent No.: US 10,698,226 B2
(45) Date of Patent: Jun. 30, 2020

(54) FLEXIBLE ILLUMINATOR

(71) Applicant: ASML HOLDING N.V., Veldhoven (NL)

(72) Inventor: Parag Vinayak Kelkar, Danbury, CT (US)

(73) Assignee: ASML Holding N.V., Veldhoven (NL)

( * ) Notice: Subject to any disclaimer, the term of this patent is extended or adjusted under 35 U.S.C. 154(b) by 23 days.

(21) Appl. No.: 15/370,931

(22) Filed: Dec. 6, 2016

(65) Prior Publication Data
US 2017/0168312 A1 Jun. 15, 2017

Related U.S. Application Data

(60) Provisional application No. 62/265,294, filed on Dec. 9, 2015.

(51) Int. Cl.
*G02B 27/14* (2006.01)
*G02B 7/02* (2006.01)
(Continued)

(52) U.S. Cl.
CPC ......... *G02B 27/283* (2013.01); *G02B 27/142* (2013.01); *G03F 7/70116* (2013.01);
(Continued)

(58) Field of Classification Search
CPC .... G02B 27/00; G02B 27/144; G02B 27/145; G02B 27/143; G02B 27/0025;
(Continued)

(56) References Cited

U.S. PATENT DOCUMENTS 6,839,095 B2 * 1/2005 Bierhuizen .......... G03B 21/006
349/9
7,030,978 B2 4/2006 Guetta et al.
(Continued)

FOREIGN PATENT DOCUMENTS

CN 101147095 3/2008
CN 101765799 6/2010
(Continued)

OTHER PUBLICATIONS

Taiwan Office Action dated Nov. 15, 2017 in corresponding Taiwan Patent Application No. 105139192.
(Continued)

*Primary Examiner* — Dawayne Pinkney
(74) *Attorney, Agent, or Firm* — Pillsbury Winthrop Shaw Pittman LLP

(57) ABSTRACT

A method is disclosed that includes splitting a beam of radiation into a first part of the beam having a first polarization and a second part of the beam having a second polarization, forming a first beam with a first polarization distribution between the first polarization and the second polarization and/or a first intensity distribution by modulating the first part of the beam, forming a second beam with a second polarization distribution between the first polarization and the second polarization and/or a second intensity distribution by modulating the second part of the beam, and combining at least a portion of the first beam having the second polarization and at least a portion of the second beam having the first polarization.

20 Claims, 5 Drawing Sheets

(51) Int. Cl.
*G02B 27/28* (2006.01)
*G03F 7/20* (2006.01)

(52) U.S. Cl.
CPC ...... *G03F 7/70133* (2013.01); *G03F 7/70566* (2013.01); *G03F 7/70633* (2013.01)

(58) Field of Classification Search
CPC .. G02B 27/1013; G02B 27/126; G02B 13/10; G02B 5/045; G02B 27/0961; G02B 5/04; H04N 9/3197; H04N 3/127; H04N 9/12; G02F 1/03; G02F 1/133526; G02F 1/133514; G03B 21/14; G03B 21/28
USPC ........ 359/629, 634, 636–640, 669, 624–625, 359/247, 831, 833–834; 353/31, 33–34, 353/70, 84, 99; 349/5–9, 106; 348/744, 348/758, 790–791
See application file for complete search history.

(56) References Cited

U.S. PATENT DOCUMENTS

| | | | |
|---|---|---|---|
| 7,192,139 | B2 | 3/2007 | Drazic et al. |
| 7,528,941 | B2 | 5/2009 | Kandel et al. |
| 7,619,735 | B2 | 11/2009 | Milshtein |
| 8,339,595 | B2 | 12/2012 | Den Boef |
| 8,411,287 | B2 | 4/2013 | Smilde et al. |
| 8,441,639 | B2 | 5/2013 | Kandel et al. |
| 8,681,413 | B2 | 3/2014 | Manassen et al. |
| 8,817,371 | B1* | 8/2014 | Boothroyd ........... G02B 27/283 359/485.02 |
| 8,848,186 | B2 | 9/2014 | Kandel et al. |
| 8,867,020 | B2 | 10/2014 | Smilde et al. |
| 8,873,054 | B2 | 10/2014 | Kandel et al. |
| 8,908,175 | B1 | 12/2014 | Kandel et al. |
| 9,080,971 | B2 | 7/2015 | Kandel et al. |
| 9,081,303 | B2 | 7/2015 | Cramer et al. |
| 9,091,650 | B2 | 7/2015 | Hill et al. |
| 9,104,120 | B2 | 8/2015 | Seligson et al. |
| 9,110,385 | B2 | 8/2015 | Den Boef |
| 9,116,103 | B2 | 8/2015 | Wang et al. |
| 9,341,954 | B2 | 5/2016 | Tanitsu |
| 2002/0012168 | A1 | 1/2002 | Li |
| 2002/0097386 | A1* | 7/2002 | Mishima ................ G03B 27/54 355/67 |
| 2006/0082731 | A1 | 4/2006 | Drazic et al. |
| 2008/0180636 | A1* | 7/2008 | Boothroyd ............ G02B 27/26 353/8 |
| 2009/0109417 | A1 | 4/2009 | Tanitsu |
| 2010/0328655 | A1 | 12/2010 | Den Boef |
| 2011/0027704 | A1 | 2/2011 | Cramer et al. |
| 2011/0043791 | A1 | 2/2011 | Smilde et al. |
| 2011/0069292 | A1 | 3/2011 | Den Boef |
| 2012/0202157 | A1* | 8/2012 | Tanitsu .............. G02B 27/0927 430/322 |
| 2012/0242970 | A1 | 9/2012 | Smilde et al. |
| 2012/0256879 | A1 | 10/2012 | Liu et al. |
| 2013/0144085 | A1 | 6/2013 | Hazin et al. |
| 2015/0015874 | A1 | 1/2015 | Chen et al. |
| 2015/0022822 | A1 | 1/2015 | Grunzweig et al. |
| 2015/0192859 | A1 | 7/2015 | Tanitsu |
| 2015/0219449 | A1 | 8/2015 | Bringoltz et al. |

FOREIGN PATENT DOCUMENTS

| | | |
|---|---|---|
| JP | 2006509242 | 3/2006 |
| JP | 2009105396 | 5/2009 |
| WO | WO 2005/094070 | 10/2005 |
| WO | 2009/078708 | 6/2009 |
| WO | 2009/106279 | 9/2009 |
| WO | WO 2013/007576 | 1/2013 |
| WO | 2013042679 | 3/2013 |
| WO | 2015/143378 | 9/2015 |

OTHER PUBLICATIONS

International Search Report and Written Opinion dated Feb. 17, 2017 in corresponding International Patent Application No. PCT/EP2016/077374.
Japanese Office Action issued in corresponding Japanese Patent Application No. 2018-530611, dated May 14, 2019.
Chinese Office Action issued in corresponding Chinese Patent Application No. 2016800724636, dated Nov. 10, 2019.
Korean Office Action issued in corresponding Korean Patent Application No. 10-2018-7019373, dated Jan. 15, 2020.
Korean Notice of Allowance issued in corresponding Korean Patent Application No. 10-2018-7019373, dated Apr. 21, 2020.

* cited by examiner

FLEXIBLE ILLUMINATOR

This application claims priority under 35 U.S.C. § 119(e) to U.S. Provisional Patent Application No. 62/265,294, filed Dec. 9, 2015, which is incorporated herein its entirety by reference.

FIELD

The present description relates to a method and apparatus for metrology usable, for example, in the manufacture of devices by a lithographic technique.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., including part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned.

In a lithographic process (i.e., a process of developing a device or other structure involving lithographic exposure, which may typically include one or more associated processing steps such as development of resist, etching, etc.), it is desirable frequently to make measurements of structures created, e.g., for process control and verification. Various tools for making such measurements are known, including scanning electron microscopes, which are often used to measure critical dimension (CD), and specialized tools to measure overlay, the accuracy of alignment of two layers of a substrate. Recently, various forms of scatterometers have been developed for use in the lithographic field. These devices direct a beam of radiation onto a target and measure one or more properties of the scattered radiation—e.g., intensity at a single angle of reflection as a function of wavelength; intensity at one or more wavelengths as a function of reflected angle; or polarization as a function of reflected angle—to obtain a "spectrum" from which a property of interest of the target can be determined. Determination of the property of interest may be performed by various techniques: e.g., reconstruction of the target structure by iterative approaches such as rigorous coupled wave analysis or finite element methods; library searches; and principal component analysis.

SUMMARY

It is desirable to provide a flexible illuminator with a simple configuration for a metrology apparatus, by which a beam of radiation with a desirable intensity distribution (i.e., illumination shape) and a desirable polarization (including optionally a desired spatial polarization distribution) may be provided.

In an embodiment, there is provided a method comprising: providing a first beam part having a first polarization and a second beam part having a second different polarization; blocking the first beam part provided the second beam part is not blocked or forming a first beam having the second polarization from the first beam part, the first beam having a first intensity distribution obtained by modulating the first beam part; blocking the second beam part provided the first beam part is not blocked or forming a second beam having the first polarization from the second beam part, the second beam having a second intensity distribution obtained by modulating the second beam part; and providing an output beam comprising the first beam and/or second beam, wherein the output beam comprises the first and/or second intensity distributions and comprises the first and/or second polarizations.

In an embodiment, there is provided an illuminator comprising: a first modulator configured to block a first beam part having a first polarization provided a second beam part having a second different polarization is not blocked or to form a first beam having the second polarization from the first beam part, the first beam having a first intensity distribution provided by modulating the first beam part; a second modulator configured to block the second beam part provided the first beam part is not blocked or to form a second beam having the first polarization from the second beam part, the second beam having a second intensity distribution provided by modulating the second beam part; and a polarization beam splitting surface configured to provide an output beam comprising the first beam and/or second beam, wherein the output beam comprises the first and/or second intensity distributions and comprises the first and/or second polarizations.

Features and/or advantages of embodiments of the invention, as well as the structure and operation of various embodiments of the invention, are described in detail herein with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

Embodiments will now be described, by way of example only, with reference to the accompanying drawings in which.

DETAILED DESCRIPTION

Before describing embodiments in detail, it is instructive to present an example environment in which embodiments may be implemented.

Figure 1:
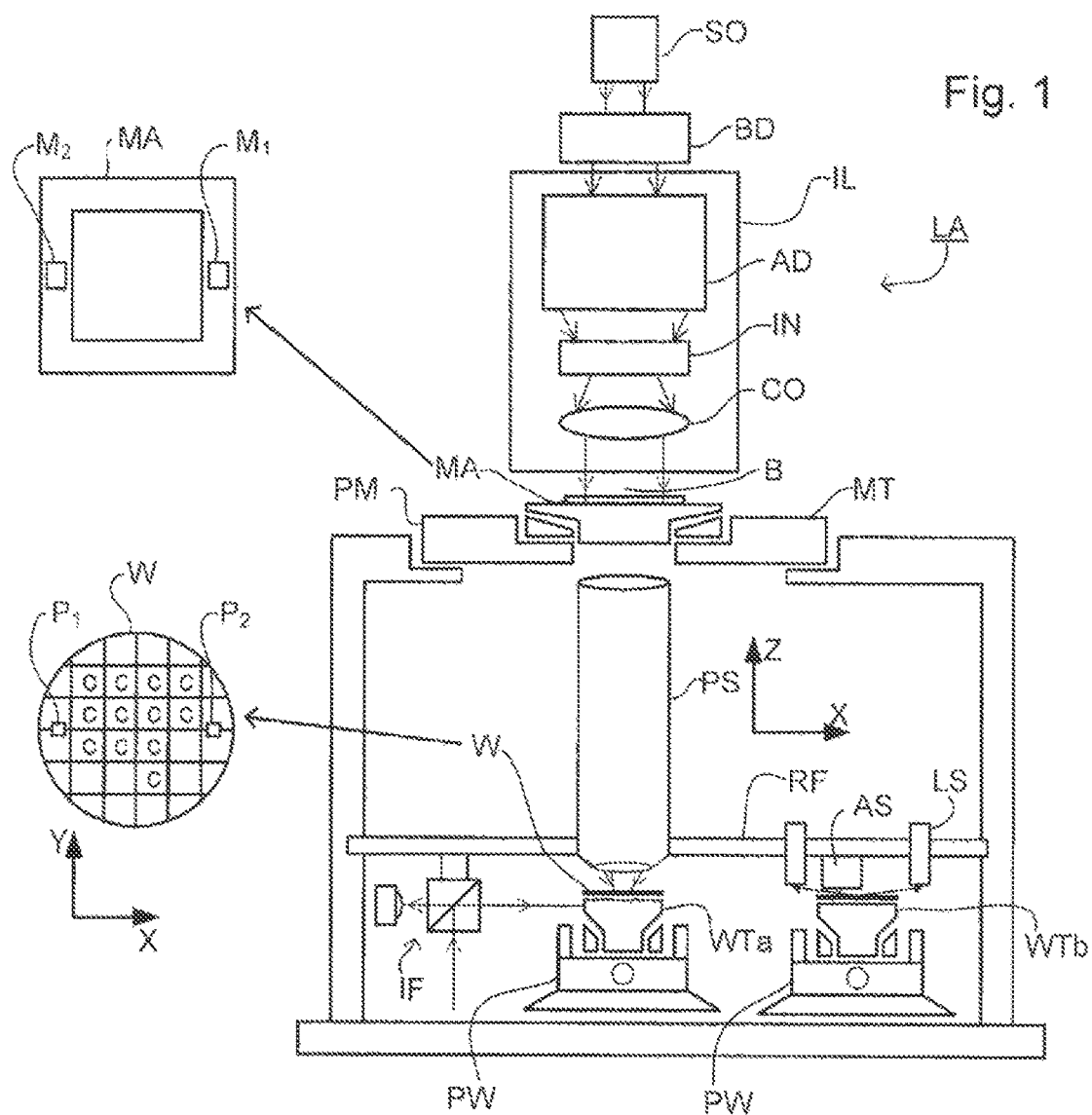
FIG. 1 schematically depicts a lithographic apparatus according to an embodiment.

FIG. 1 schematically depicts a lithographic apparatus LA. The apparatus includes an illumination system (illuminator) IL configured to condition a radiation beam B (e.g., UV radiation or DUV radiation), a patterning device support or support structure (e.g., a mask table) MT constructed to support a patterning device (e.g., a mask) MA and connected to a first positioner PM configured to accurately position the patterning device in accordance with certain parameters; a substrate table (e.g., a wafer table) WT constructed to hold a substrate (e.g., a resist coated wafer) W and connected to a second positioner PW configured to accurately position the substrate in accordance with certain parameters; and a projection system (e.g., a refractive projection lens system) PS configured to project a pattern imparted to the radiation beam B by patterning device MA onto a target portion C (e.g., including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The patterning device support holds the patterning device in a manner that depends on the orientation of the patterning device, the design of the lithographic apparatus, and other conditions, such as for example whether or not the patterning device is held in a vacuum environment. The patterning device support can use mechanical, vacuum, electrostatic or other clamping techniques to hold the patterning device. The patterning device support may be a frame or a table, for example, which may be fixed or movable as required. The patterning device support may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is reflected by the mirror matrix.

As here depicted, the apparatus is of a transmissive type (e.g., employing a transmissive mask). Alternatively, the apparatus may be of a reflective type (e.g., employing a programmable mirror array of a type as referred to above, or employing a reflective mask).

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD for adjusting the angular and/or spatial intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross section.

The radiation beam B is incident on the patterning device (e.g., mask) MA, which is held on the patterning device support (e.g., mask table MT), and is patterned by the patterning device. Having traversed the patterning device (e.g., mask) MA, the radiation beam B passes through the projection system PS, which focuses the beam onto a target portion C of the substrate W. With the aid of the second positioner PW and position sensor IF (e.g., an interferometric device, linear encoder, 2-D encoder or capacitive sensor), the substrate table WT can be moved accurately, e.g., so as to position different target portions C in the path of the radiation beam B. Similarly, the first positioner PM and another position sensor (which is not explicitly depicted in FIG. 1) can be used to accurately position the patterning device (e.g., mask) MA with respect to the path of the radiation beam B, e.g., after mechanical retrieval from a mask library, or during a scan.

Patterning device (e.g., mask) MA and substrate W may be aligned using mask alignment marks $M_1$, $M_2$ and substrate alignment marks $P_1$, $P_2$. Although the substrate alignment marks as illustrated occupy dedicated target portions, they may be located in spaces between target portions (these are known as scribe-lane alignment marks). Similarly, in situations in which more than one die is provided on the patterning device (e.g., mask) MA, the mask alignment marks may be located between the dies. Small alignment markers may also be included within dies, in amongst the device features, in which case it is desirable that the markers be as small as possible and not require any different imaging or process conditions than adjacent features. An embodiment of an alignment system, which can detect the alignment markers, is described further below.

The depicted apparatus could be used in at least one of the following modes:

1. In step mode, the patterning device support (e.g., mask table) MT and the substrate table WTa are kept essentially stationary, while an entire pattern imparted to the radiation beam is projected onto a target portion C at one time (i.e., a single static exposure). The substrate table WTa is then shifted in the X and/or Y direction so that a different target portion C can be exposed. In step mode, the maximum size of the exposure field limits the size of the target portion C imaged in a single static exposure.

2. In scan mode, the patterning device support (e.g., mask table) MT and the substrate table WTa are scanned synchronously while a pattern imparted to the radiation beam is projected onto a target portion C (i.e., a single dynamic exposure). The velocity and direction of the substrate table WTa relative to the patterning device support (e.g., mask table) MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the patterning device support (e.g., mask table) MT is kept essentially stationary holding a programmable patterning device, and the substrate table WTa is moved or scanned while a pattern imparted to the radiation beam is projected onto a target portion C. In this mode, generally a pulsed radiation source is employed and the programmable patterning device is updated as required after each movement of the substrate table WTa or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Lithographic apparatus LA is of a so-called dual stage type which has two tables WTa, WTb (e.g., two substrate tables) and two stations—an exposure station and a measurement station—between which the tables can be exchanged. For example, while a substrate on one table is being exposed at the exposure station, another substrate can be loaded onto the other substrate table at the measurement station and various preparatory steps carried out. The preparatory steps may include mapping the surface control of the substrate using a level sensor LS and measuring the position of alignment markers on the substrate using an alignment sensor AS, both sensors being supported by a reference frame RF. If the position sensor IF is not capable of measuring the position of a table while it is at the measurement station as well as at the exposure station, a second position sensor may be provided to enable the positions of the table to be tracked at both stations. As another example, while a substrate on one table is being exposed at the exposure station, another table without a substrate waits at the measurement station (where optionally measurement activity may occur). This other table has one or more measurement devices and may optionally have other tools (e.g., cleaning apparatus). When the substrate has completed exposure, the table without a substrate moves to the exposure station to perform, e.g., measurements and the table with the substrate moves to a location (e.g., the measurement station) where the substrate is unloaded and another substrate is load. These multi-table arrangements enable a substantial increase in the throughput of the apparatus.

Figure 2:
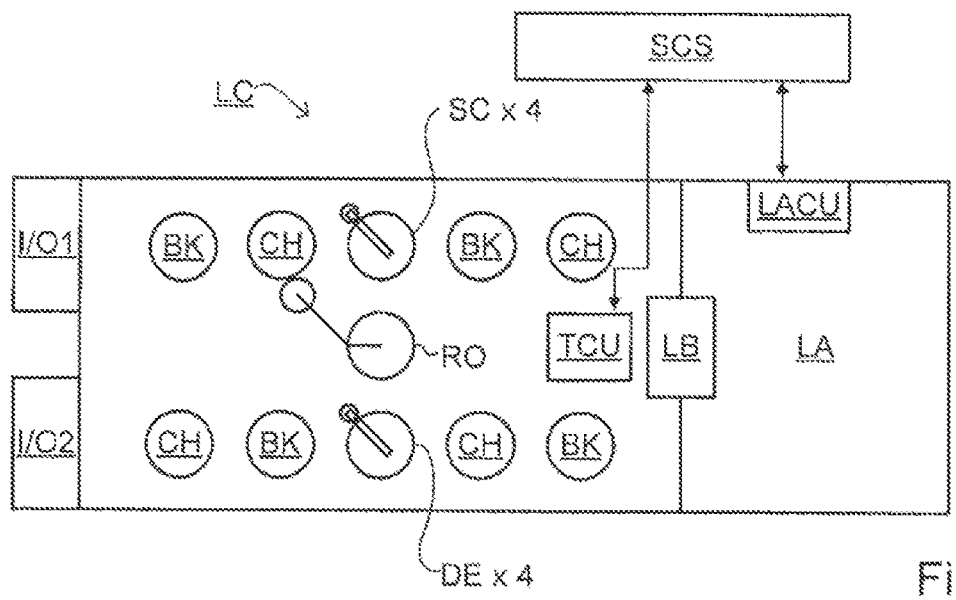
FIG. 2 schematically depicts a lithographic cell or cluster according to an embodiment.

As shown in FIG. 2, the lithographic apparatus LA forms part of a lithographic cell LC, also sometimes referred to as a lithocell or lithocluster, which also includes apparatus to perform one or more pre- and post-exposure processes on a substrate. Conventionally these include one or more spin coaters SC to deposit a resist layer, one or more developers DE to develop exposed resist, one or more chill plates CH and one or more bake plates BK. A substrate handler, or robot, RO picks up a substrate from input/output ports I/O1, I/O2, moves it between the different process devices and delivers it to the loading bay LB of the lithographic apparatus. These devices, which are often collectively referred to as the track, are under the control of a track control unit TCU which is itself controlled by the supervisory control system SCS, which also controls the lithographic apparatus via lithographic control unit LACU. Thus, the different apparatus may be operated to maximize throughput and processing efficiency.

In order that the substrate that is exposed by the lithographic apparatus is exposed correctly and consistently, it is desirable to inspect an exposed substrate to measure one or more properties such as overlay error between subsequent layers, line thickness, critical dimension (CD), etc. If an error is detected, an adjustment may be made to an exposure of one or more subsequent substrates, especially if the inspection can be done soon and fast enough that another substrate of the same batch is still to be exposed. Also, an already exposed substrate may be stripped and reworked (to improve yield) or discarded, thereby avoiding performing an exposure on a substrate that is known to be faulty. In a case where only some target portions of a substrate are faulty, a further exposure may be performed only on those target portions which are good. Another possibility is to adapt a setting of a subsequent process step to compensate for the error, e.g. the time of a trim etch step can be adjusted to compensate for substrate-to-substrate CD variation resulting from the lithographic process step.

An inspection apparatus is used to determine one or more properties of a substrate, and in particular, how one or more properties of different substrates or different layers of the same substrate vary from layer to layer and/or across a substrate. The inspection apparatus may be integrated into the lithographic apparatus LA or the lithocell LC or may be a stand-alone device. To enable most rapid measurements, it is desirable that the inspection apparatus measure one or more properties in the exposed resist layer immediately after the exposure. However, the latent image in the resist has a very low contrast—there is only a very small difference in refractive index between the part of the resist which has been exposed to radiation and that which has not—and not all inspection apparatus have sufficient sensitivity to make useful measurements of the latent image. Therefore measurements may be taken after the post-exposure bake step (PEB) which is customarily the first step carried out on an exposed substrate and increases the contrast between exposed and unexposed parts of the resist. At this stage, the image in the resist may be referred to as semi-latent. It is also possible to make measurements of the developed resist image—at which point either the exposed or unexposed parts of the resist have been removed—or after a pattern transfer step such as etching. The latter possibility limits the possibility for rework of a faulty substrate but may still provide useful information, e.g. for the purpose of process control.

A target used by a conventional scatterometer comprises a relatively large periodic structure layout (e.g., comprising one or more gratings), e.g., 40 μm by 40 μm. In that case, the measurement beam often has a spot size that is smaller than the periodic structure layout (i.e., the layout is underfilled such that one or more of the periodic structures is not completely covered by the spot). This simplifies mathematical reconstruction of the target as it can be regarded as infinite. However, for example, so the target can be positioned in among product features, rather than in the scribe lane, the size of a target has been reduced, e.g., to 20 μm by 20 μm or less, or to 10 μm by 10 μm or less. In this situation, the periodic structure layout may be made smaller than the measurement spot (i.e., the periodic structure layout is overfilled). Typically such a target is measured using dark field scatterometry in which the zeroth order of diffraction (corresponding to a specular reflection) is blocked, and only higher orders processed. Examples of dark field metrology can be found in PCT patent application publication nos. WO 2009/078708 and WO 2009/106279, which are hereby incorporated in their entirety by reference. Further developments of the technique have been described in U.S. patent application publications US2011-0027704, US2011-0043791 and US2012-0242970, which are hereby incorporated in their entirety by reference. Diffraction-based overlay using dark-field detection of the diffraction orders enables overlay measurements on smaller targets. These targets can be smaller than the illumination spot and may be surrounded by product structures on a substrate. In an embodiment, multiple targets can be measured in one image.

In an embodiment, the target on a substrate may comprise one or more 1-D periodic gratings, which are printed such that after development, the bars are formed of solid resist lines. In an embodiment, the target may comprise one or more 2-D periodic gratings, which are printed such that after development, the one or more gratings are formed of solid resist pillars or vias in the resist. The bars, pillars or vias may alternatively be etched into the substrate. The pattern of the grating is sensitive to chromatic aberrations in the lithographic projection apparatus, particularly the projection system PL, and illumination symmetry and the presence of such aberrations will manifest themselves in a variation in the printed grating. Accordingly, the measured data of the printed gratings can be used to reconstruct the gratings. The parameters of the 1-D grating, such as line widths and shapes, or parameters of the 2-D grating, such as pillar or via widths or lengths or shapes, may be input to the reconstruction process, performed by processing unit PU, from knowledge of the printing step and/or other measurement processes.

Figure 3A:
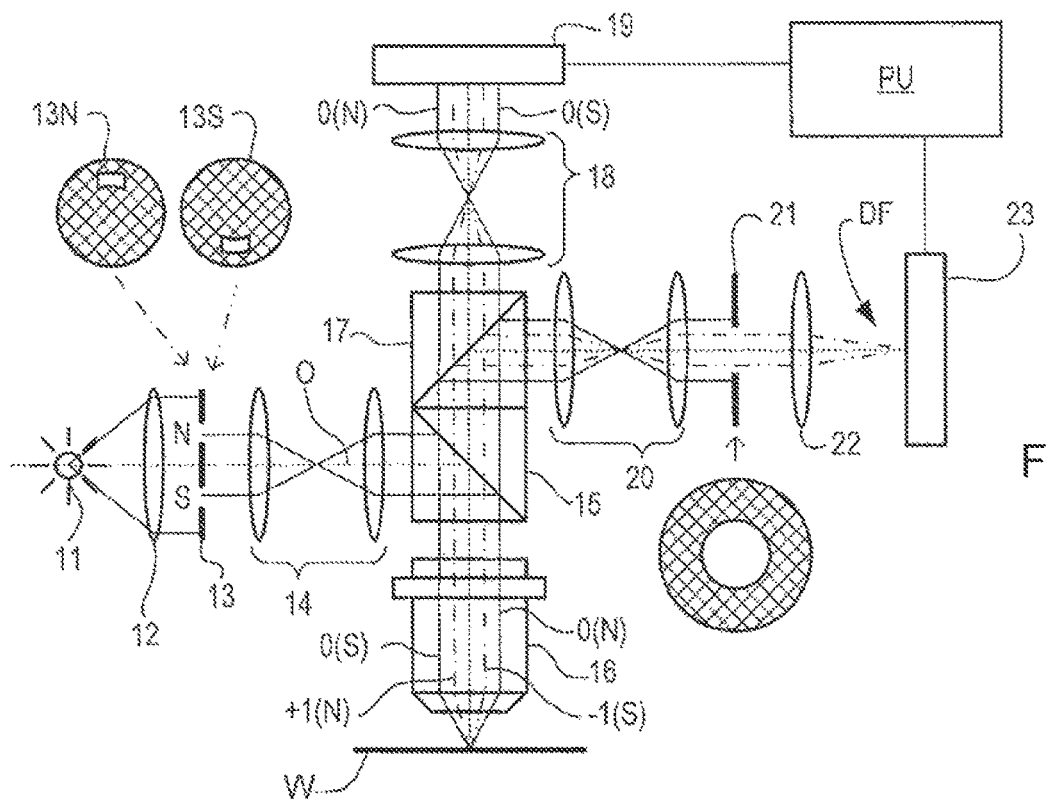
FIG. 3A is schematic diagram of a dark field measurement apparatus for use in measuring targets according to an embodiment using a first pair of illumination apertures providing certain illumination modes.

A dark field metrology apparatus suitable for use in embodiments is shown in FIG. 3A. A target T (comprising a periodic structure such as a grating) and diffracted rays are illustrated in more detail in FIG. 3B. The dark field metrology apparatus may be a stand-alone device or incorporated in either the lithographic apparatus LA, e.g., at the measurement station, or the lithographic cell LC. An optical axis, which has several branches throughout the apparatus, is represented by a dotted line O. In this apparatus, radiation emitted by an output 11 (e.g., a source such as a laser or a xenon lamp or an opening connected to a source) is directed onto substrate W via a prism 15 by an optical system comprising lenses 12, 14 and objective lens 16. These lenses are arranged in a double sequence of a 4F arrangement. A different lens arrangement can be used, provided that it still provides a substrate image onto a detector.

In an embodiment, the lens arrangement allows for access of an intermediate pupil-plane for spatial-frequency filtering. Therefore, the angular range at which the radiation is incident on the substrate can be selected by defining a spatial intensity distribution in a plane that presents the spatial spectrum of the substrate plane, here referred to as a (conjugate) pupil plane. In particular, this can be done, for example, by inserting an aperture plate 13 of suitable form between lenses 12 and 14, in a plane which is a back-projected image of the objective lens pupil plane. In the example illustrated, aperture plate 13 has different forms, labeled 13N and 13S, allowing different illumination modes to be selected. The illumination system in the present examples forms an off-axis illumination mode. In the first illumination mode, aperture plate 13N provides off-axis illumination from a direction designated, for the sake of description only, as 'north'. In a second illumination mode, aperture plate 13S is used to provide similar illumination, but from an opposite direction, labeled 'south'. Other modes of illumination are possible by using different apertures. The rest of the pupil plane is desirably dark as any unnecessary radiation outside the desired illumination mode may interfere with the desired measurement signals.

Figures 3B, 3C, 3D:
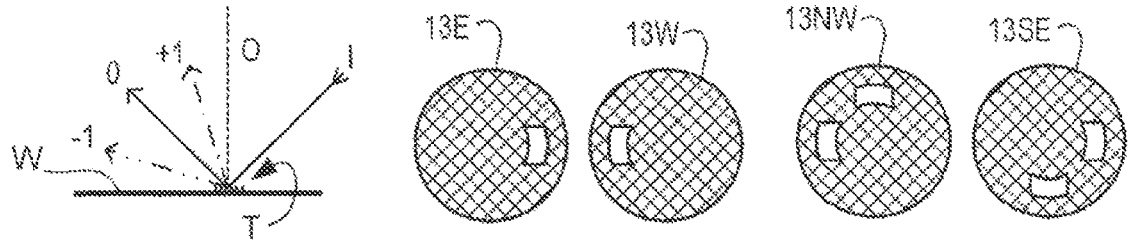
FIG. 3B is a schematic detail of a diffraction spectrum of a target for a given direction of illumination.
FIG. 3C is a schematic illustration of a second pair of illumination apertures providing further illumination modes in using a measurement apparatus for diffraction based overlay measurements.
FIG. 3D is a schematic illustration of a third pair of illumination apertures combining the first and second pairs of apertures providing further illumination modes in using a measurement apparatus for diffraction based overlay measurements.

As shown in FIG. 3B, target T is placed with substrate W substantially normal to the optical axis O of objective lens 16. A ray of illumination I impinging on target T from an angle off the axis O gives rise to a zeroth order ray (solid line 0) and two first order rays (dot-chain line +1 and double dot-chain line −1). With an overfilled small target T, these rays are just one of many parallel rays covering the area of the substrate including metrology target T and other features. Since the aperture in plate 13 has a finite width (necessary to admit a useful quantity of radiation), the incident rays I will in fact occupy a range of angles, and the diffracted rays 0 and +1/−1 will be spread out somewhat. According to the point spread function of a small target, each order +1 and −1 will be further spread over a range of angles, not a single ideal ray as shown. Note that the periodic structure pitch and illumination angle can be designed or adjusted so that the first order rays entering the objective lens are closely aligned with the central optical axis. The rays illustrated in FIGS. 3A and 3B are shown somewhat off axis, purely to enable them to be more easily distinguished in the diagram.

At least the 0 and +1 orders diffracted by the target on substrate W are collected by objective lens 16 and directed back through prism 15. Returning to FIG. 3A, both the first and second illumination modes are illustrated, by designating diametrically opposite apertures labeled as north (N) and south (S). When the incident ray I is from the north side of the optical axis, that is when the first illumination mode is applied using aperture plate 13N, the +1 diffracted rays, which are labeled +1(N), enter the objective lens 16. In contrast, when the second illumination mode is applied using aperture plate 13S the −1 diffracted rays (labeled −1(S)) are the ones which enter the lens 16. Thus, in an embodiment, measurement results are obtained by measuring the target twice under certain conditions, e.g., after rotating the target or changing the illumination mode or changing the imaging mode to obtain separately the $-1^{st}$ and the +1$^{st}$ diffraction order intensities. Comparing these intensities for a given target provides a measurement of asymmetry in the target, and asymmetry in the target can be used as an indicator of a parameter of a lithography process, e.g., overlay error. In the situation described above, the illumination mode is changed.

A beam splitter 17 divides the diffracted beams into two measurement branches. In a first measurement branch, optical system 18 forms a diffraction spectrum (pupil plane image) of the target on first sensor 19 (e.g. a CCD or CMOS sensor) using the zeroth and first order diffractive beams. Each diffraction order hits a different point on the sensor, so that image processing can compare and contrast orders. The pupil plane image captured by sensor 19 can be used for focusing the metrology apparatus and/or normalizing intensity measurements of the first order beam. The pupil plane image can also be used for many measurement purposes such as reconstruction, which are not described in detail here.

In the second measurement branch, optical system 20, 22 forms an image of the target on the substrate W on sensor 23 (e.g. a CCD or CMOS sensor). In the second measurement branch, an aperture stop 21 is provided in a plane that is conjugate to the pupil-plane. Aperture stop 21 functions to block the zeroth order diffracted beam so that the image DF of the target formed on sensor 23 is formed from the −1 or +1 first order beam. The images captured by sensors 19 and 23 are output to image processor and controller PU, the function of which will depend on the particular type of measurements being performed. Note that the term 'image' is used here in a broad sense. An image of the periodic structure features (e.g., grating lines) as such will not be formed, if only one of the −1 and +1 orders is present.

The particular forms of aperture plate 13 and stop 21 shown in FIG. 3 are purely examples. In another embodiment, on-axis illumination of the targets is used and an aperture stop with an off-axis aperture is used to pass substantially only one first order of diffracted radiation to the sensor. In yet other embodiments, 2nd, 3rd and higher order beams (not shown in FIG. 3) can be used in measurements, instead of or in addition to the first order beams.

In order to make the illumination adaptable to these different types of measurement, the aperture plate 13 may comprise a number of aperture patterns formed around a disc, which rotates to bring a desired pattern into place. Note that aperture plate 13N or 13S are used to measure a periodic structure of a target oriented in one direction (X or Y depending on the set-up). For measurement of an orthogonal periodic structure, rotation of the target through 90° and 270° might be implemented. Different aperture plates are shown in FIGS. 3C and D. FIG. 3C illustrates two further types of off-axis illumination mode. In a first illumination mode of FIG. 3C, aperture plate 13E provides off-axis illumination from a direction designated, for the sake of description only, as 'east' relative to the 'north' previously described. In a second illumination mode of FIG. 3C, aperture plate 13W is used to provide similar illumination, but from an opposite direction, labeled 'west'. FIG. 3D illustrates two further types of off-axis illumination mode. In a first illumination mode of FIG. 3D, aperture plate 13NW provides off-axis illumination from the directions designated 'north' and 'west' as previously described. In a second illumination mode, aperture plate 13SE is used to provide similar illumination, but from an opposite direction, labeled 'south' and 'east' as previously described. The use of these, and numerous other variations and applications of the apparatus are described in, for example, the prior published patent application publications mentioned above.

Figure 4:
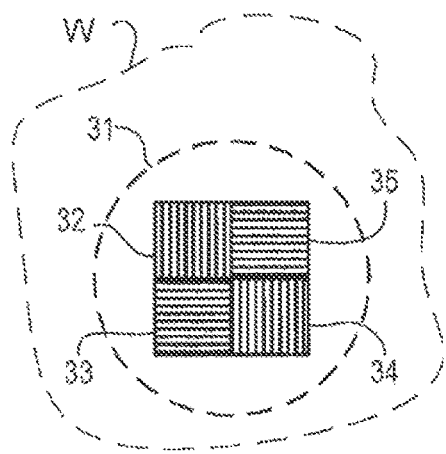
FIG. 4 schematically depicts a form of multiple periodic structure (e.g., multiple grating) target and an outline of a measurement spot on a substrate.

FIG. 4 depicts an example composite metrology target formed on a substrate. The composite target comprises four periodic structures (in this case, gratings) 32, 33, 34, 35 positioned closely together. In an embodiment, the periodic structures are positioned closely together enough so that they all are within a measurement spot 31 formed by the illumination beam of the metrology apparatus. In that case, the four periodic structures thus are all simultaneously illuminated and simultaneously imaged on sensors 19 and 23. In an example dedicated to overlay measurement, periodic structures 32, 33, 34, 35 are themselves composite periodic structures (e.g., composite gratings) formed by overlying periodic structures, i.e., periodic structures are patterned in different layers of the device formed on substrate W and such that at least one periodic structure in one layer overlays at least one periodic structure in a different layer. Such a target may have outer dimensions within 20 µm×20 µm or within 16 µm×16 µm. Further, all the periodic structures are used to measure overlay between a particular pair of layers. To facilitate a target being able to measure more than a single pair of layers, periodic structures 32, 33, 34, 35 may have differently biased overlay offsets in order to facilitate measurement of overlay between different layers in which the different parts of the composite periodic structures are formed. Thus, all the periodic structures for the target on the substrate would be used to measure one pair of layers and all the periodic structures for another same target on the substrate would be used to measure another pair of layers, wherein the different bias facilitates distinguishing between the layer pairs.

Returning to FIG. 4, periodic structures 32, 33, 34, 35 may also differ in their orientation, as shown, so as to diffract incoming radiation in X and Y directions. In one example, periodic structures 32 and 34 are X-direction periodic structures with biases of +d, −d, respectively. Periodic structures 33 and 35 may be Y-direction periodic structures with offsets +d and −d respectively. While four periodic structures are illustrated, another embodiment may include a larger matrix to obtain desired accuracy. For example, a 3×3 array of nine composite periodic structures may have biases −4d, −3d, −2d, −d, 0, +d, +2d, +3d, +4d. Separate images of these periodic structures can be identified in the image captured by sensor 23.

Figure 5:
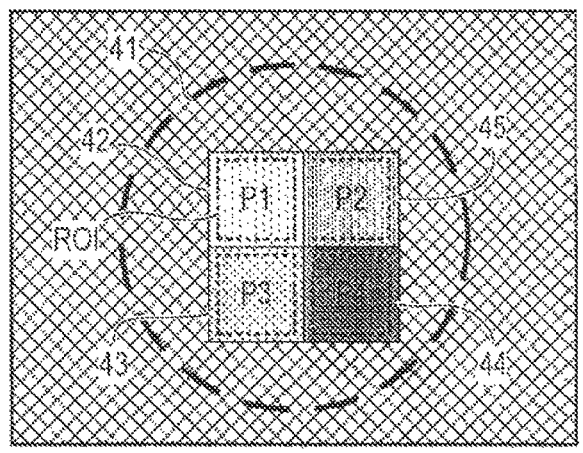
FIG. 5 schematically depicts an image of the target of FIG. 4 obtained in the apparatus of FIG. 3.

FIG. 5 shows an example of an image that may be formed on and detected by the sensor 23, using the target of FIG. 4 in the apparatus of FIG. 3, using the aperture plates 13NW or 13SE from FIG. 3D. While the sensor 19 cannot resolve the different individual periodic structures 32 to 35, the sensor 23 can do so. The dark rectangle represents the field of the image on the sensor, within which the illuminated spot 31 on the substrate is imaged into a corresponding circular area 41. Within this, rectangular areas 42-45 represent the images of the periodic structures 32 to 35. If the periodic structures are located in product areas, product features may also be visible in the periphery of this image field. Image processor and controller PU processes these images using pattern recognition to identify the separate images 42 to 45 of periodic structures 32 to 35. In this way, the images do not have to be aligned very precisely at a specific location within the sensor frame, which greatly improves throughput of the measuring apparatus as a whole.

Once the separate images of the periodic structures have been identified, the intensities of those individual images can be measured, e.g., by averaging or summing selected pixel intensity values within the identified areas. Intensities and/or other properties of the images can be compared with one another. These results can be combined to measure different parameters of the lithographic process. Overlay performance is an example of such a parameter.

The measurement accuracy and/or sensitivity of the target may vary with respect to one or more characteristics of the beam of radiation provided onto the target, for example, the wavelength of the radiation beam, the polarization of the radiation beam, and/or the intensity distribution (i.e., angular or spatial intensity distribution) of the radiation beam. In an embodiment, the wavelength range of the radiation beam is limited to one or more wavelengths selected from a range (e.g., selected from the range of about 400 nm to 900 nm). Further, a selection of different polarizations of the radiation beam may be provided and various illumination shapes can be provided using, for example, a plurality of different apertures.

To enable, for example, improved measurement accuracy and/or sensitivity, it is desirable to provide a flexible illuminator, with a relatively simple configuration, for a metrology apparatus. The flexible illuminator can provide a beam of radiation with a desirable intensity distribution (i.e., illumination shape) and polarization.

Figure 6:
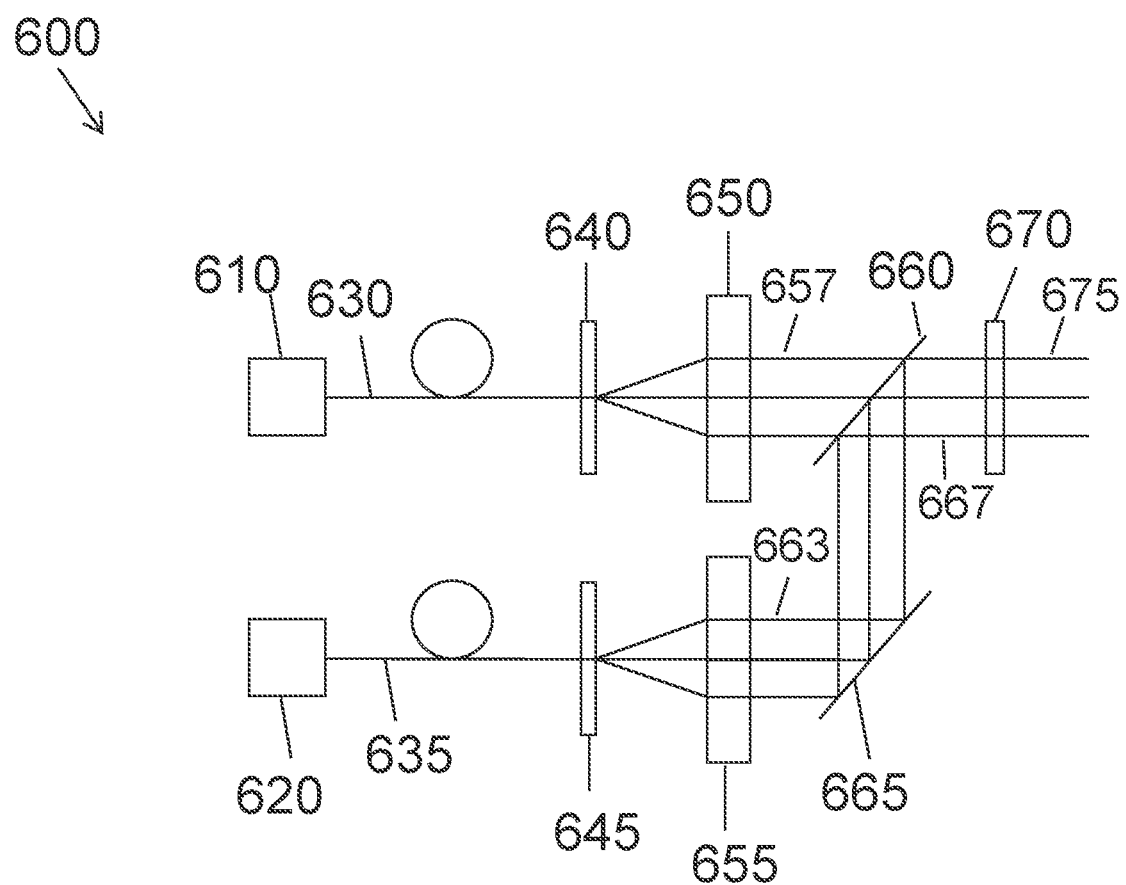
FIG. 6 depicts a schematic illustration of an illuminator.

FIG. 6 depicts a schematic illustration of an example illuminator 600 that provides a beam of radiation with controlled polarization and selective intensity distribution (i.e., the illumination shape) for, for example, an inspection or other metrology apparatus. Such an illuminator can replace, for example, the elements 11, 12, 13 of the metrology apparatus of FIG. 5.

As shown in FIG. 6, the illuminator 600 comprises at least two radiation beam inputs 610 and 620 (e.g., laser sources 610 and 620) to provide at least two beams of radiation. The beams of radiation may be polarized. In an embodiment, the wavelength of the radiation beams is one or more wavelengths selected from the range of about 400 nm-900 nm. In an embodiment, the radiation beam has a nominal wavelength and a relatively narrow bandwidth.

Associated with the input 610 and 620 are optical fibers 630 and 635 to transmit the respective beams 657, 663 from the inputs 610 and 620 to respective fiber mounts 640 and 645. The fiber tips of the fibers 630 and 635 are located at or near the focal planes of respective lenses 650 and 655. The lenses 650, 655 respectively convert the spot beams of radiation to parallel (or collimated) beams of radiation. The fiber mount 640 and lens 650 may be collectively referred to as a first collimator. Similarly, the fiber mount 645 and lens 655 may be collectively referred to as a second collimator.

The illuminator 600 further comprises at least two polarization beam splitters (PBSs) 660 and 665 arranged to receive respectively beams 657 and 663. Each beam splitter is selective for a different polarization. In an example embodiment, beam splitters 660, 665 may reflect S polarized radiation and transmit P polarized radiation. As is known, S polarization refers to the component of the electrical field of the radiation that is perpendicular to the plane made by the propagation direction of the radiation and a vector perpendicular to the plane of a reflecting surface. S polarization is also referred to as transverse electric (TE). P polarization refers to the component of the electric field parallel to the plane made by the propagation direction of the radiation and the vector perpendicular to the plane of the reflecting surface. P polarization is also referred to as transverse magnetic (TM).

Thus, the beam splitters 660, 665 are collectively configured to combine a part of the beam 657 having a first polarization (e.g. P polarization) and a part of the beam 663 having a second different polarization (e.g., S polarization) and transmit the combined radiation as a beam 667 to an illumination mode selector (IMS) 670. By modulating whether the beam 657 or 663 is on or off, the polarization of the output beam 667 can be switched between the first and second polarizations. When both beam 657 and beam 663 are on, the polarization of the output beam 667 is a combination of the first and second polarization, and the amounts of which can be adjusted by control of the respective inputs (e.g., change the input radiation power). So, the polarization (e.g., S polarization, P polarization, or a combination thereof) of the output beam 675 may be controlled by varying the output of the input 610, the input 620, or both.

As an example where beam splitters 660, 665 reflect S polarized radiation and transmit P polarized radiation, the beam 657 from the input 610 and the beam 663 from the input 620 hit the surfaces of the PBSs 660 and 665, respectively. At least a part of the beam 663 having S polarization is reflected at the surface of the PBS 665, and is subsequently reflected at the surface of the PBS 660 into the beam 667, while the other part of the beam 663 having P polarization (not shown), if any, transmits through the surface of the PBS 665, and is thereby lost. Further, a part of the beam 657 having the S polarization (not shown), if any, is reflected at the surface of the PBS 660 and is thereby lost, while at least part of the beam 657 having P polarization transmits through the PBS 660 and combines with the part of the beam 663 having S polarization to form combined beam 667.

Figure 7A:
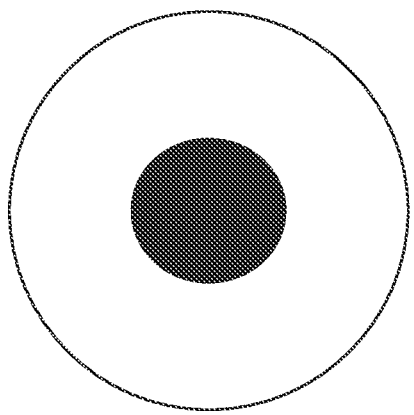
FIGS. 7A-7D schematically depict examples of different illumination shapes.
Figure 7B:
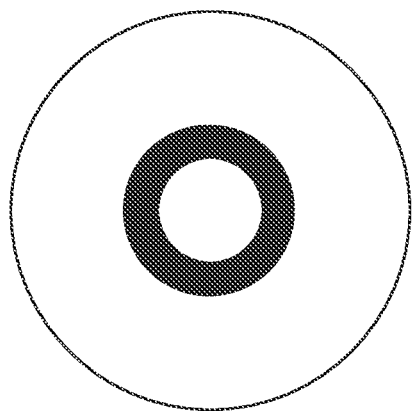
Figure 7C:
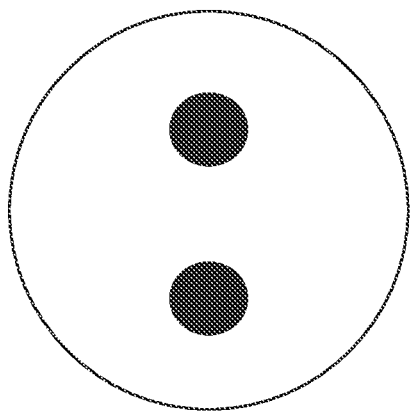
Figure 7D:
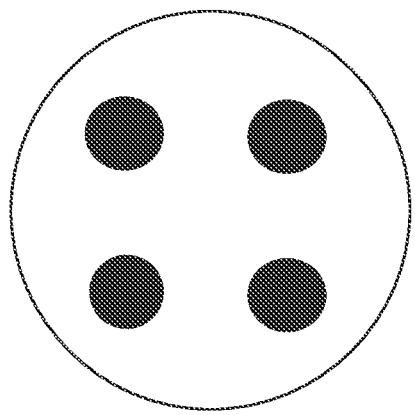

The illuminator 600 further comprises an illumination mode selector (IMS) 670 with different illumination masks (e.g., a turret arrangement that inserts different aperture arrangements into the beam path). So, by employing an appropriate illumination mask from the IMS 670, a corresponding intensity distribution (i.e., illumination shape) is provided to the combined beam 667 to form the output beam of radiation 675. Various embodiments of the illumination shapes are illustrated in FIG. 7A-7D, including a monopole as shown in FIG. 7A, an annular ring as shown in FIG. 7B, a dipole as shown in FIG. 7C, and a quadrupole as shown in FIG. 7D. Although only four illumination shapes are illustrated in FIG. 7A-7D, the IMS 670 may provide other suitable illumination shapes by employing desirable illumination masks.

Although the illuminator 600 may provide certain flexibility in polarization selection and variation in intensity distribution of the illumination beam 675, the illuminator 600 has a complex configuration—e.g., it may include two laser sources 610,620, two fibers 640 and 645, two fiber mounts 640 and 645, two PBSs 660 and 665, etc. In addition, selection of intensity distribution (i.e., the illumination shape) of the illumination beam 675 is limiting, depending on the illumination masks of IMS 670. Therefore, it is challenging, if not impossible, to create an arbitrary illumination shape for the illumination beam 675 using IMS 670. The illuminator 600 is also not particularly energy efficient. As described above, optical power is lost at the PBSs 660 and 665. For example, part of the beam 657 having S polarization and part of the beam 665 having P polarization can be lost. Further, it is not particularly feasible to create a desired spatial distribution of polarization (e.g., a multipole illumination with one pole having a different polarization than another pole). Therefore, it is desirable to provide, for example, an illuminator with a simple configuration and a flexible capability of providing an illumination beam with a desirable intensity distribution and a desirable polarization (including optionally a spatial polarization distribution).

Figure 8:
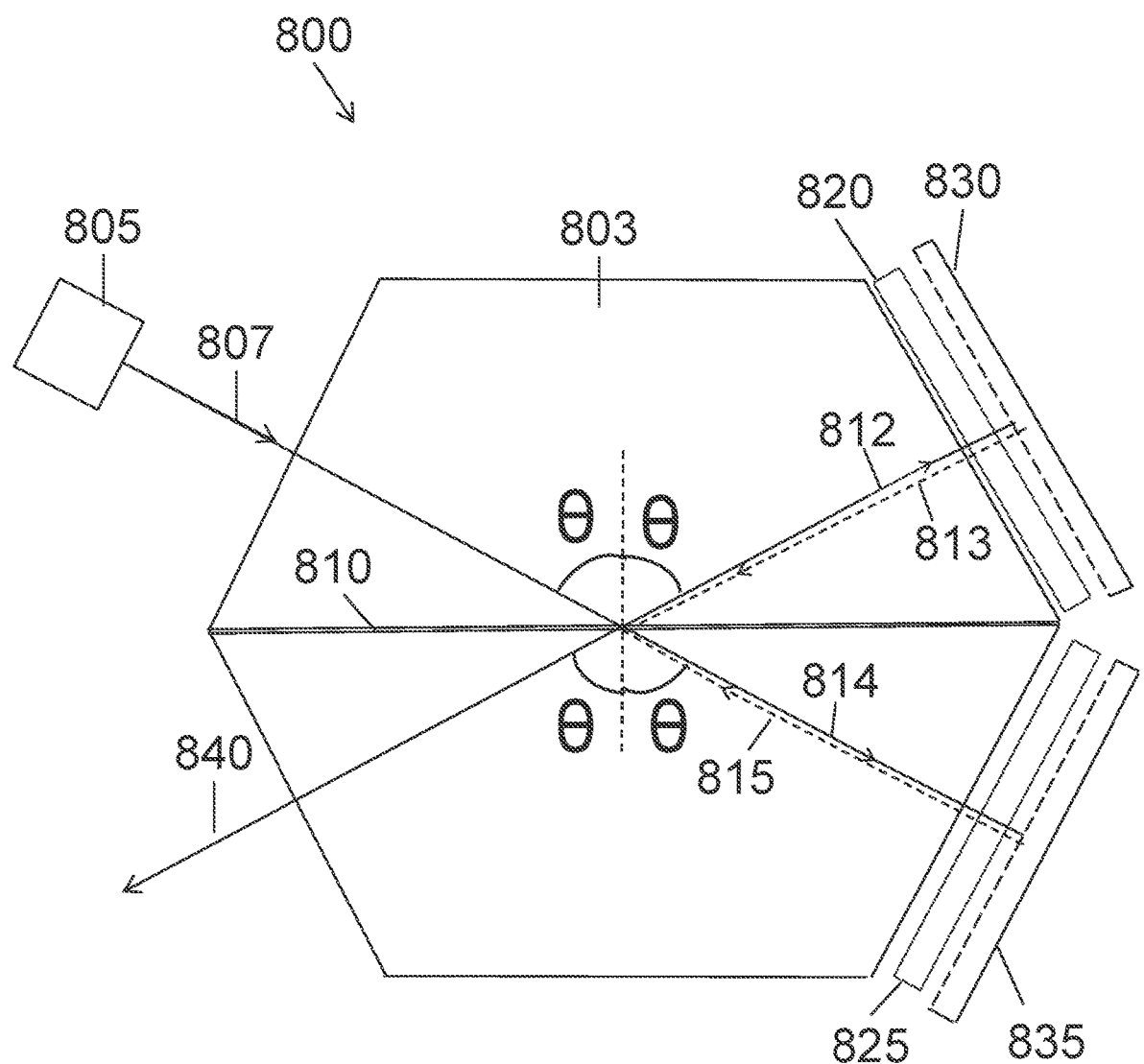
FIG. 8 schematically depicts an illuminator according to an embodiment.

FIG. 8 depicts a schematic illustration of an illuminator 800 according to an embodiment. As shown in FIG. 8, the illuminator 800 comprises an input 805 (e.g., a laser source) to provide a beam of radiation 807 incident to a prism 803. In an embodiment, the input 805 is a laser source 805 emitting a beam of radiation with one or more wavelengths selected from the range of about 400-900 nm. In an embodiment, the input 805 is a suitable optical system or an illumination system that emits a beam of radiation.

In an embodiment, the beam of radiation 807 is polarized. In an embodiment, the beam 807 comprises at least two different polarizations. In an embodiment, the beam 807 comprises P polarization and S polarization. The discussions before and hereafter focus on P polarization and S polarization as an example of different polarization. However, different combinations of polarization may be used including combinations that use just S polarization or just P polarization, in combination with another polarization.

In an embodiment, the prism 803 is monolithic in that it is constructed as a unit with its components thereof attached to each other and to other elements, if any (e.g., a material of a polarization beam splitting surface 810), as shown in FIG. 8. In an embodiment, the prism 803 comprises separate components. For example, the portion of prism 803 above the polarization beam splitting surface 810 in FIG. 8 may be a separate optical element than the portion of prism 803 below the polarization beam splitting surface 810 in FIG. 8 and they may be separated from each other by a gap. In an embodiment, the prism 803 is made of fused silica.

As referred to above, the illuminator 800 further comprises a polarization beam splitting surface 810, which has a similar function to the PBSs 660 and 665, configured to separate part of the beam having a first polarization (e.g., P polarization) and a part of the beam having a second different polarization (e.g., S polarization). The configuration of the polarization beam splitting surface 810 and any material used for the surface 810 would be appropriately selected for the polarizations used.

Using the S and P polarization example, the beam 807 emitted by the input 805 enters the prism 803 and is incident on the surface 810 at, in this instance, the Brewster's angle θ relative to the direction perpendicular to the surface 810. A first beam part 812 having, e.g., P or S polarization is reflected by the surface 810 and travels toward a first quarter wave plate 820 and a first spatial light modulator 830, and a second beam part 814 having, e.g., the other of P or S polarization 814 transmits through the surface 810 and travels toward a second quarter wave plate 825 and a second spatial light modulator 835. The Brewster's angle θ is determined by the refractive index of the prism 803 and the coating material of the surface 810. In an embodiment, the Brewster's angle θ is 55.74° when the prism 803 is made of fused silica. In an embodiment, the radiation is incident on the surface 810 at the Brewster angle to enable high contrast and/or a high extinction ratio.

In an embodiment, the surface 810 comprises a coating on material (e.g., fused silica) of the prism 803. The coating is an optimization of parameters comprising: angle of incidence, coating design (e.g., thickness of layer(s), numbers of layers, etc.) and material (e.g., one or two or more materials), and material of the substrate on which the coating is applied (e.g., the material of prism 803). The Brewster angle depends on the refractive index at each wavelength which is given by the dispersion curve and hence Brewster angle is different for different wavelengths. Accordingly to enable the illuminator to work over a range of 400-900 nm (or a sub-range thereof, such as 400-650 nm or 650-900 nm or a sub-range of 100, 125 or 150 nm within the range of 400-900 nm), the surface 810 is coated because otherwise the surface 810 would have usability at a single wavelength or a small range of wavelengths. Without a coating, the polarizations can leak into unwanted paths since the extinction ratio is not high at each wavelength without a coating. The coating on surface 810 allows broadening of the usable wavelength range. Having the angle of incidence at or close to the Brewster angle of the substrate helps in simplifying the selection of coating design and material(s) and achieving a better extinction ratio. In an embodiment, the coating design and material are selected such that the extinction ratio or contrast ratio for the polarizations is greater than or equal to about 1000 across the wavelength range of the illuminator (e.g., 400-900 nm, or a sub-range thereof, such as 400-650 nm, 650-900 nm or a sub-range of 100, 125 or 150 nm within the range of 400-900 nm. Additionally, the coating design and material are selected for angle of incidence to the coating close or equal to the Brewster angle for the substrate to which the coating is provided, wherein close is within about 1 degree of the Brewster angle. Additionally or alternatively, the coating design and material are selected to be essentially non-absorbing (e.g., more than or equal to about 95% transmittance or less than or equal to 5% absorbance).

As an example, the following coating design can be used for a fused silica prism: Substrate (L H)*8 (1.2L 1.2H)*4 (1.4L 1.4H)*4 (1.6L 1.6H)*4 (1.8L 1.8H)*6 L Substrate, where L=quarter wave optical thickness of silicon dioxide ($SiO_2$) at 650 nm and H=quarter wave optical thickness of tantalum pentoxide ($Ta_2O_5$) at 650 nm (as is conventional, the notation signifies a multilayer stack with, e.g., eight (8) combination of layers L and H stacked on top each other, followed by four (4) combination of layers 1.2L and 1.2H (where 1.2L is 1.2 times the thickness of layer L) stacked on top of each other, and so on. This coating at or about a 55.74 degree angle of incidence can produce greater than 1000 contrast ratio between P and S polarizations at the output.

The first quarter wave plate 820 and the second quarter wave plate 825 are configured to rotate the polarization angles of the first beam part 812 and the second beam part 814 by +45 degrees, respectively. This is done because the first spatial light modulator 830 and the second spatial light modulator 835 operate only, or better, when the polarization of the beam parts 812 and 814 are oriented at a specific angle or range of angles. Accordingly, in an embodiment, the first quarter wave plate 820 and the second quarter wave plate 825 are not necessary and may be omitted.

After the first spatial light modulator 830 modulates the first beam part 812 to form a first modulated beam 813, the first modulated beam 813 travels back to the surface 810 through the first quarter wave plate 820, which rotates the polarization angle of the first modulated beam 813 by −45 degrees. Similarly, after the second spatial light modulator 835 modulates the second beam part 814 to form a second modulated beam 815, the second modulated beam 815 travels back to the surface 810 through the second quarter wave plate 825 which rotates the polarization angle of the second beam modulated 815 by −45 degrees. As described further hereafter, the first modulated beam 813 and the second modulated beam 815 are combined at surface 810 to form an output 840.

In an embodiment, the first beam part 813 has a different polarization than the first modulated beam 812. Similarly, in an embodiment, the second beam part 815 has a different polarization than the second modulated beam 814. In an embodiment, the first modulated beam 812 has the same polarization as the second beam part 815 and the second modulated beam 814 has the same polarization as the first beam part 813. In an embodiment, the difference in polarization between the first beam part 813 and the first modulated beam 812 and between the second beam part 815 and the second modulated beam 814 is provided by the first spatial light modulator 830 and the second spatial light modulator 835, respectively, or an optical component in the optical path between the spatial light modulator and the surface 810. An embodiment of the first spatial light modulator 830 and the second spatial light modulator 835 changing the polarization is discussed below.

In an embodiment, the first spatial light modulator 830 and the second spatial light modulator 835 provide desired intensity distributions (i.e., illumination shapes) for the first beam 813 and the second beam 815, respectively. Unlike the IMS 670 which provides only a limited number of predetermined illumination shapes to the illumination beam 667, the spatial light modulators (e.g., the first spatial light modulator 830 and the second spatial light modulator 835) are capable of providing arbitrary illumination shapes for the illumination beams according to the user's specification. For example, the first spatial light modulator 830 and the second spatial light modulator 835 may provide any of the illumination shapes as shown in FIGS. 7A-7D, by turning "ON" or "OFF" the appropriate pixels of the first spatial light modulator 830 and the second spatial light modulator 835, respectively, according to the desired illumination shape. In an embodiment, the first spatial light modulator 830 and the second spatial light modulator 835 provide a same illumination shape for the first beam 813 and the second beam 815. In an embodiment, the first spatial light modulator 830 provides a different illumination shape to first beam 813 than the second spatial light modulator 835 provides to the second beam 815. For example, the first spatial light modulator 830 may provide one or more poles of a multipole illumination arrangement, while the second spatial light modulator 835 may be provide one or more other poles of the multipole illumination arrangement. As discussed further hereafter, the first beam 813 may have a different polarization than the second beam 815 and accordingly, for example, different poles of a multipole illumination arrangement can have different polarizations.

In an embodiment, the first spatial light modulator 830 and the second spatial light modulator 835 are respectively liquid crystal on silicon systems (LCoSs), each of which is made of a liquid crystal layer on top of a silicon backplane. A LCoS can, in addition to providing a desired intensity distribution, also change the polarization of the incident radiation. So, the first spatial light modulator 830 and second spatial light modulator 835 in the form of LCoSs can provide the difference in polarization between the first beam part 813 and the first modulated beam 812 and between the second beam part 815 and the second modulated beam 814 respectively.

So, in an embodiment, the first spatial light modulator 830 and the second spatial light modulator 835 (or an optical component in the optical path between the spatial light modulator and the surface 810) enable provision of a desirable polarization to the output beam 840 via control of the nature of the polarization and of the intensity distribution of the first and second modulated beams 813 and 815. In an embodiment, each of the spatial light modulators 830, 835 is effectively dedicated to providing a particular different polarization to the output beam. So, a particular polarization may be excluded from the output beam 840 by the respective spatial light modulator 830, 835 not returning a respective first and second modulated beam 813, 815. Further, the proportions of the different polarizations can be similarly controlled by the respective spatial light modulator 830, 835 by controlling the intensity of the respective first and second modulated beam 813, 815 output by the respective spatial light modulator 830, 835. And, as described above, the spatial distribution of the polarization can be controlled by appropriate configuration of the intensity distribution (angular or spatial) by the respective spatial light modulator 830, 835.

So, as an example, where the surface 810 is reflective of S polarization and transmissive of P polarization, the first spatial light modulator 830 can be dedicated to control of the P polarization in the output beam 840 in terms of whether the output beam 840 has any, in terms of the proportion of P polarization in the output beam 840, and/or in terms of the spatial distribution of P polarization in the output beam 840. Similarly, the second spatial light modulator 835 can be dedicated to control of the S polarization in the output beam 840 in terms of whether the output beam 840 has any, in terms of the proportion of S polarization in the output beam 840, and/or in terms of the spatial distribution of S polarization in the output beam 840.

Continuing with this example, the first spatial light modulator 830 may convert the polarization of the first beam part 812 so that 100% of the first modulated beam 813 has P polarization, which passes through surface 810 to form part of output beam 840. As another example, the first spatial light modulator 830 may process the polarization so that some proportion (e.g., 50%) of the first modulated beam 813 has P polarization, and another proportion (e.g., 50%) remains S polarization, so that the proportion (e.g., 50%) of the first modulated beam 813 that has P polarization passes through surface 810 to form part of output beam 840 and the proportion (e.g., 50%) that has S polarization reflects off surface 810 to effectively a beam dump. Similarly, for example, the second spatial light modulator 835 may convert the polarization of the second beam part 814 so that 100% of the second modulated beam 815 has S polarization, which reflects off surface 810 to form part of output beam 840. As another example, the second spatial light modulator 835 may process the polarization so that some proportion (e.g., 30%) of the second modulated beam 815 has P polarization, and another proportion (e.g., 70%) remains S polarization, so that the proportion (e.g., 30%) of the first modulated beam 813 that has P polarization passes through surface 810 to effectively a beam dump, while the proportion (e.g., 70%) that has S polarization reflects off surface 810 to become part of output beam 840.

So, as described above, the first modulated beam 813 and the second modulated beam 815 may hit the surface 810 at, for example, the Brewster's angle $\theta$ relative to the direction perpendicular to the surface 810, respectively. As a result, a part, if any, of the first modulated beam 813 having, e.g., P polarization passes through the surface 810 to form part of the output beam 840, and the part of the first modulated beam 813 having, e.g., the S polarization is reflected and thereby doesn't become part of the output beam 840. Similarly, a part, if any, of the second modulated beam 815 having, e.g., the P polarization passes through the surface 810 and thereby doesn't become part of the output beam 840, and the part of the second modulated beam 815 having S polarization is reflected by the surface 810 and is combined with the part of the first modulated beam 813 having, e.g., the P polarization to form the output illumination beam 840 that exits the prism 803 with the desirable polarization (and optionally spatial polarization distribution) and desirable intensity distribution.

In an embodiment, the polarization in the output beam 840 can be controlled by, additionally or alternatively to the first modulated beam 813 and/or the second modulated beam 815, the polarization of the beam 807. Therefore, the polarization in the output illumination beam 840 may be varied by adjusting the polarization of the beam radiation 807, such as by adjusting the proportion of different polarizations in the beam 807. In an embodiment, the polarization proportion in the beam 807 between the different polarization (e.g., P polarization and S polarization) may be changed by using one or more polarizers. For example, by rotating one or more polarizers, a certain portion of the P polarized part and/or the S polarized part of the beam 807 that passes through the one or more polarizers is blocked. Accordingly, the polarization proportion in the beam 807 is changed.

So, in operation of the illuminator 800, a beam of radiation 807 is incident to the prism 803 at, for example, a right angle to the entrance surface. The beam of radiation 807 travels toward the surface 810 at desirably the Brewster's angle θ, where the beam 807 is split into at least two parts corresponding to different polarizations. A first beam part 812 having, e.g., S polarization is reflected at the surface 810 and travels toward the first spatial light modulator 830 and through the optional first quarter wave plate 820 (which rotates the polarization angle of the first beam part 812 by +45 degrees). The first spatial light modulator 830 modulates the first beam part 812 to form the first modulated beam 813 with a desirable intensity distribution and desirable polarization. In an embodiment, the first spatial light modulator 830 does not emit a first modulated beam 813 such that output beam 840 does not have, e.g., P polarization. In an embodiment, the first spatial light modulator 830 provides a first modulated beam 813 with at least some, e.g., P polarization, which as discussed further below will form part of output beam 840. The first modulated beam 813, if any, travels toward the surface 810 through the first quarter wave plate 820 (which rotates the polarization angle of the first modulated beam 813 by −45 degrees) and at desirably the Brewster's angle relative to the direction perpendicular to the surface 810. Part of the first modulated beam 813 having, e.g., S polarization, if any, is reflected at surface 810 and thereby does not form part of output beam 840, and part of the first modulated beam 813 having P polarization transmits through the surface 810 to form part of output beam 840.

Further, the second beam part 814 having, e.g., P polarization passes through the surface 810 and travels toward the second spatial light modulator 835 and through the optional second quarter wave plate 825 (which rotates the polarization angle of the second beam part 814 by +45 degrees). The second spatial light modulator 835 modulates the second beam part 814 to form the second modulated beam 815 with a desirable intensity distribution and desirable polarization. In an embodiment, the second spatial light modulator 835 does not emit a second modulated beam 815 such that output beam 840 does not have, e.g., S polarization. In an embodiment, the second spatial light modulator 835 provides a second modulated beam 815 with at least some, e.g., S polarization, which as discussed further below will form part of output beam 840. The second modulated beam 815, if any, travels toward the surface 810 through the second quarter wave plate 825 (which rotates the polarization angle of the second modulated beam 815 by −45 degrees) and at desirably the Brewster's angle relative to the direction perpendicular to the surface 810. Part of the second modulated beam 815 having, e.g., P polarization, if any, transmits through the surface 810 and thereby does not form part of output beam 840, and part of the second modulated beam 815 having S polarization is reflected at surface 810 to form part of output beam 840.

Thus, all or part of the first modulated beam 813, if any, that passes through surface 810, i.e., P polarization radiation, is combined with all or part of the second modulated beam 815, if any, that reflects from surface 810, i.e., S polarization radiation, to form output illumination beam 840, which exits the prism 803.

In an embodiment, a single beam 807 is input to the prism 803 as shown in FIG. 8. In an embodiment, a plurality of beams 807 is input to the prism 803 and all or some of them may be input as shown in FIG. 8. In an embodiment, a plurality of beams 807 is input to the prism 803 and at least two of them are input at different portions of the prism 803. For example, a first beam 807 may be input in the general location shown in FIG. 8 and may be directed toward the first spatial modulator 830, rather than toward the surface 810. In this case, the first beam 807 may have a particular first polarization, e.g., S polarization. Further, a second beam 807 may be input in the corresponding bottom portion of prism 803 below the surface 810 and be directed toward the second spatial modulator 835. The second beam 807 may have a particular second different polarization, e.g., P polarization. The illuminator 800 may otherwise operate the same. Thus, in this embodiment, surface 810 does not split the beam 807 but rather just selects the radiation to provide to the output beam 840.

In an embodiment, a same surface 810 acts both to split the beam 807 and select the radiation to provide to the output beam 840. In an embodiment, a surface 810 or optical element may be used to split beam 807 that is different from a surface 810 or optical element to select the radiation to provide to the output beam 840.

While two spatial light modulators are depicted in FIG. 8, a different number of spatial light modulators may be provided. In an embodiment, each of the spatial light modulators may effectively control a different polarization.

Advantageously, the illuminator 800 has a simple configuration with a small number of components. Therefore, the alignment and mechanical tolerances are expected to be easier to control. Further, the spatial light modulators (e.g., the first spatial light modulator 830 and the second spatial light modulator 835) in the illuminator 800 can enable provision of a desired polarization (including optionally a spatial polarization distribution) and intensity distribution for the output illumination beam (e.g., the output illumination beam 840) according to the user's specification. This provides a significantly flexible illuminator for, for example, a metrology apparatus.

In an embodiment, there is provided a method of illuminating in or for a metrology apparatus, the method comprising: splitting a beam of radiation into a first beam part having a first polarization and a second beam part having a second different polarization; forming a first beam having the second polarization from the first beam part and/or having a first intensity distribution by modulating the first beam part; forming a second beam having the first polarization from the second beam part and/or having a second intensity distribution by modulating the second beam part; and combining at least a portion of the first beam part and at least a portion of the second beam part.

In an embodiment, the method further comprises transmitting the beam at an angle relative to a surface of a polarization beam splitting surface. In an embodiment, the angle is equal to Brewster's angle.

In an embodiment, there is provided an illuminator of a metrology apparatus, the illuminator comprising: a first polarization beam splitting surface configured to split a beam of radiation into a first beam part having a first polarization and a second beam part having a second different polarization; a first modulator configured to modulate the first beam part to provide a first beam with a first intensity distribution and/or to provide the first beam having the second polarization from the first beam part; a second modulator configured to modulate the second beam part to form a second beam with a second intensity distribution and/or to provide the second beam having the first polarization from the second beam part; and a second polarization beam splitting surface configured to combine at least a portion of the first beam and at least a portion of the second beam.

In an embodiment, the illuminator further comprises a laser source configured to emit the beam of radiation to the first polarization beam splitting surface at an angle relative to a direction perpendicular to the surface. In an embodiment, the angle is equal to Brewster's angle.

In an embodiment, the first polarization beam splitting surface is the same as the second polarization beam splitting surface.

In an embodiment, the first modulator and/or the second modulator is a LCoS.

In an embodiment, the first polarization is S polarization and the second polarization is P polarization.

In an embodiment, the first intensity distribution and/or the second intensity distribution are provided with arbitrary shapes according to a specification.

In an embodiment, there is provided a method comprising: providing a first beam part having a first polarization and a second beam part having a second different polarization; blocking the first beam part provided the second beam part is not blocked or forming a first beam having the second polarization from the first beam part, the first beam having a first intensity distribution obtained by modulating the first beam part; blocking the second beam part provided the first beam part is not blocked or forming a second beam having the first polarization from the second beam part, the second beam having a second intensity distribution obtained by modulating the second beam part; and providing an output beam comprising the first beam and/or second beam, wherein the output beam comprises the first and/or second intensity distributions and comprises the first and/or second polarizations.

In an embodiment, providing the first and second beam parts comprising splitting an input beam using a polarization beam splitting surface, the beam splitting surface being reflective of the first polarization and transmissive of the second polarization, or vice versa. In an embodiment, the method further comprises providing the input beam at an angle about equal to Brewster's angle relative to the surface. In an embodiment, the providing the output beam comprises using the polarization beam splitting surface to combine the first beam and/or second beam. In an embodiment, the polarization beam splitting surface comprising a coating. In an embodiment, modulating the first beam part is performed by a liquid crystal on silicon system (LCoS) and/or modulating the second beam part is performed by a LCoS. In an embodiment, the first polarization is S polarization and the second polarization is P polarization. In an embodiment, the first intensity distribution and the second intensity distribution are substantially the same. In an embodiment, the first intensity distribution and/or the second intensity distribution is provided with an arbitrary shape according to a specification.

In an embodiment, there is provided an illuminator comprising: a first modulator configured to block a first beam part having a first polarization provided a second beam part having a second different polarization is not blocked or to form a first beam having the second polarization from the first beam part, the first beam having a first intensity distribution provided by modulating the first beam part; a second modulator configured to block the second beam part provided the first beam part is not blocked or to form a second beam having the first polarization from the second beam part, the second beam having a second intensity distribution provided by modulating the second beam part; and a polarization beam splitting surface configured to provide an output beam comprising the first beam and/or second beam, wherein the output beam comprises the first and/or second intensity distributions and comprises the first and/or second polarizations.

In an embodiment, the illuminator comprises a polarization beam splitting surface configured to split an input beam of radiation into the first and second beam parts, the beam splitting surface being reflective of the first polarization and transmissive of the second polarization, or vice versa. In an embodiment, the polarization beam splitting surface configured to provide the output beam and to split the input beam are the same surface. In an embodiment, the input beam is at an angle about equal to Brewster's angle relative to the surface. In an embodiment, the polarization beam splitting surface comprises a coating. In an embodiment, the first modulator and/or the second modulator is a liquid crystal on silicon system (LCoS). In an embodiment, the first polarization is S polarization and the second polarization is P polarization. In an embodiment, the first and second modulators are configured to provide the first intensity distribution that is substantially the same as the second intensity distribution. In an embodiment, the first and second modulators are configured to provide the first intensity distribution and/or second intensity distribution with an arbitrary shape according to a specification.

Embodiments have been described herein in relation to diffraction-based metrology, which, for example, measures the relative position of overlapping periodic structures from the intensity from the diffracted orders. However, embodiments herein may be applied, with appropriate modification where needed, to image-based metrology, which, for example, measures the relative position from target 1 in layer 1 to target 2 in layer 2 using high-quality images of the targets. Usually these targets are periodic structures or "boxes" (Box-in-Box (BiB)).

Although specific reference may have been made above to the use of embodiments in the context of metrology and optical lithography, it will be appreciated that embodiments may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

The foregoing description of the specific embodiments reveals the general nature of embodiments of the invention such that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description by example, and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

The invention claimed is:

1. A method comprising:
providing an input beam having a first polarization and a second different polarization, using a polarizer arrangement configured to polarize radiation;
receiving the input beam having the first and second polarizations to a prism arrangement;
outputting a first beam part having the first polarization from the prism arrangement toward a first modulator;
outputting a second beam part having the second different polarization from the prism arrangement toward a second modulator;
blocking the first beam part provided the second beam part is not blocked or forming a first beam having the second polarization from the first beam part, the first beam having a first intensity thstribution obtained by modulating the first beam part using the first modulator, the first modulator receiving radiation having a certain wavelength;
blocking the second beam part provided the first beam part is not blocked or forming a second beam having the first polarization from the second beam part, the second beam having a second intensity distribution obtained by modulating the second beam part using the second modulator, the second modulatorreceiving radiation having the same certain wavelength;
providing an output beam comprising the first beam and/or second beam from a surface of the prism arrangement, wherein the output beam comprises the first and/or second intensity distributions and comprises the first and/or second polarizations;
directing the output beam toward a substrate using an objective;
receiving, by the objective, radiation of the output beam redirected by the substrate; and
receiving and sensing redirected radiation from the objective by a sensor.

2. The method of claim 1, further comprising splitting the input beam using a polarization beam splitting surface of the prism arrangement, the beam splitting surface being reflective of the first polarization and transmissive of the second polarization, or vice versa.

3. The method of claim 2, further comprising providing the input beam at an angle about equal to Brewster's angle relative to the surface.

4. The method of claim 2, wherein the providing the output beam comprises using the polarization beam splitting surface to process the first beam and/or second beam.

5. The method of claim 2, wherein the polarization beam splitting surface comprising a coating.

6. The method of claim 1, wherein modulating the first beam part is performed by a liquid crystal on silicon system (LCoS) and/or modulating the second beam part is performed by a LCoS.

7. The method, of claim 1, wherein the first polarization is S polarization and the second polarization is P polarization.

8. The method of claim 1, comprising forming the first and second beams and wherein the first intensity distribution and the second intensity distribution are different.

9. The method of claim 1, wherein the first intensity distribution and/or the second intensity distribution is provided with an arbitrary shape according to a specification.

10. The method of claim 1, further comprising determining CD, alignment and/or overlay from sensed redirected radiation.

11. A metrology system, comprising:
an illuminator comprising:
a polarizer arrangement configured to polarize radiation so as to provide an input beam having a first polarization and a second different polarization;
a prism arrangement configured to receive the input beam having the first and second polarizations, to output a first beam part having the first polarization and to output a second beam part having the second different polarization;
a first modulator configured to receive the first beam part output from the prism arrangement and block the first beam part provided the second beam part is not blocked or to form a first beam having the second polarization from the first beam part, the first beam having a first intensity distribution provided by modulating the first beam part using a modulating surface of the first modulator,
a second modulator configured to receive the second beam part output from the prism arrangement and block the second beam part provided the first beam part is not blocked or to form a second beam having the first polarization from the second beam part, the second beam having a second intensity distribution provided by modulating the second beam part using a modulating surface of the second modulator, and
a polarization beam splitting surface of the prism arrangement, the polarization beam splitting surface configured to provide an output beam comprising the first beam and/or second beam, wherein the output beam comprises the first and/or second intensity distributions and comprises the first and/or second polarizations;
an objective configured to direct the output beam toward a substrate and to receive radiation of the output beam redirected by the substrate; and
a detector configured to receive and sense redirected radiation from the objective.

12. The metrology system of claim 11, comprising a polarization beam splitting surface configured to split the input beam of radiation into the first and second beam parts, the polarization beam splitting surface configured to split the input beam of radiation being reflective of the first polarization and transmissive of the second polarization, or vice versa.

13. The metrology system of claim 12, wherein the polarization beam splitting surface configured to provide the output beam and to split the input beam are the same surface.

14. The metrology system of claim 12, wherein the input beam is at an angle about equal to Brewster's angle relative to the surface.

15. The metrology system of claim 12, wherein the polarization beam splitting surface configured to provide the output beam and/or to split the input beam comprises a coating.

16. The metrology system of claim 11, wherein the first modulator and/or the second modulator is a liquid crystal on silicon system (LCoS).

17. The metrology system of claim 11, wherein the first polarization is S polarization and the second polarization is P polarization.

18. The metrology system of claim 11, wherein the first and second modulators are configured to provide the first intensity distribution that is different than the second intensity distribution.

19. The metrology system of claim 11, wherein the first and second modulators are configured to provide the first intensity distribution and/or second intensity distribution with an arbitrary shape according to a specification.

20. The metrology system of claim 11, further comprising a control system configured to determine CD, alignment and/or overlay from sensed redirected radiation.

* * * * *